(12) United States Patent
Yamada et al.

(10) Patent No.: US 11,749,773 B2
(45) Date of Patent: Sep. 5, 2023

(54) AVALANCHE PHOTODIODE AND METHOD FOR MANUFACTURING SAME

(71) Applicant: Nippon Telegraph and Telephone Corporation, Tokyo (JP)

(72) Inventors: Yuki Yamada, Tokyo (JP); Fumito Nakajima, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 289 days.

(21) Appl. No.: 17/414,452

(22) PCT Filed: Dec. 4, 2019

(86) PCT No.: PCT/JP2019/047440
§ 371 (c)(1),
(2) Date: Jun. 16, 2021

(87) PCT Pub. No.: WO2020/129648
PCT Pub. Date: Jun. 25, 2020

(65) Prior Publication Data
US 2022/0037549 A1 Feb. 3, 2022

(30) Foreign Application Priority Data
Dec. 19, 2018 (JP) ................. 2018-237029

(51) Int. Cl.
*H01L 31/107* (2006.01)
*H01L 31/0336* (2006.01)
(Continued)

(52) U.S. Cl.
CPC ........ *H01L 31/107* (2013.01); *H01L 31/0336* (2013.01); *H01L 31/18* (2013.01); *H01L 31/028* (2013.01); *H01L 31/0304* (2013.01)

(58) Field of Classification Search
None
See application file for complete search history.

(56) References Cited

U.S. PATENT DOCUMENTS

2004/0056179 A1* 3/2004 Wang ............... H01L 27/1443
257/E27.128
2004/0245592 A1* 12/2004 Harmon ............. G01J 1/4228
257/E27.128
(Continued)

FOREIGN PATENT DOCUMENTS

WO WO-2018008960 A1 * 1/2018 ....... H01L 31/02005

OTHER PUBLICATIONS

Hirota, Y. et al., "Reliable non-Zn-diffused InP/InGaAs avalanche photodiode with buried n-InP layer operated by electron injection mode," Electronics Letters, vol. 40, No. 21, Oct. 14, 2004, 2 pages.
(Continued)

*Primary Examiner* — Evren Seven
(74) *Attorney, Agent, or Firm* — Slater Matsil, LLP

(57) ABSTRACT
An embodiment avalanche photodiode includes a substrate, an n-type contact layer, a buffer layer, a multiplication layer, a field-control layer, an absorption layer, and a p-type contact layer. A conductive layer is formed in a central part of the buffer layer. The substrate is constituted of a semiconductor with a higher thermal conductivity than InP such as SiC, and the n-type contact layer is constituted of a same semiconductor as the substrate and is made n-type.

11 Claims, 6 Drawing Sheets

(51) Int. Cl.
  *H01L 31/18* (2006.01)
  *H01L 31/028* (2006.01)
  *H01L 31/0304* (2006.01)

(56) References Cited

U.S. PATENT DOCUMENTS

| | | | | |
|---|---|---|---|---|
| 2005/0051861 | A1* | 3/2005 | Shi | H01L 31/107 |
| | | | | 257/438 |
| 2006/0249747 | A1* | 11/2006 | Shushakov | H03F 3/70 |
| | | | | 257/E27.128 |
| 2009/0121305 | A1* | 5/2009 | Pan | H01L 31/18 |
| | | | | 438/69 |
| 2010/0009492 | A1* | 1/2010 | Vu | H01L 21/02488 |
| | | | | 438/93 |
| 2013/0043372 | A1* | 2/2013 | Wehner | H01L 27/14652 |
| | | | | 250/208.1 |
| 2020/0052147 | A1* | 2/2020 | Mazzillo | H01L 31/12 |

OTHER PUBLICATIONS

Liu, H. et al., "4H-SiC PIN Recessed-Window Avalanche Photodiode With High Quantum Efficiency," IEEE Photonics Technology Letters, vol. 20, No. 18, Sep. 15, 2008, 3 pages.

Masana, F.N., "Thermal characterisation of power modules," Microelectronics Reliability, vol. 40, Jun. 3, 1999, 7 pages.

Takagi, H. et al., "Surface activated bonding of silicon wafers at room temperature," Applied Physics Letters, vol. 68, No. 16, Feb. 9, 1996, 4 pages.

* cited by examiner

AVALANCHE PHOTODIODE AND METHOD FOR MANUFACTURING SAME

This patent application is a national phase filing under section 371 of PCT/JP2019/047440, filed Dec. 4, 2019, which claims the priority of Japanese patent application no. 2018-237029, filed Dec. 19, 2018, each of which is incorporated herein by reference in its entirety.

TECHNICAL FIELD

The present invention relates to an avalanche photodiode and a manufacturing method thereof.

BACKGROUND ART

In optical communications, a light-receiving element is an element responsible for converting an optical signal that is propagated through an optical fiber into an electrical signal. With recent increases in communication capacity at data centers and the like, there is a need to increase transmission capacity of an optical fiber communication system, and high speed is required for light-receiving elements used in the optical fiber communication system. Examples of high-speed semiconductor light-receiving elements include a PIN photodiode (PIN-PD) and an avalanche photodiode (APD). Among these examples, avalanche photodiodes have a built-in signal-amplifying function and are widely used as light-receiving elements with higher sensitivity than PIN photodiodes.

As an avalanche photodiode for optical communications, an element in which an n-type contact layer, a multiplication layer, a field-control layer, an absorption layer, and a p-type contact layer are stacked in this order on an InP substrate has been proposed (NPL 1). In this element, the absorption layer is constituted of InGaAs with a high light absorption coefficient in a communication wavelength band (1.55 µm or 1.3 µm). In addition, in this element, the multiplication layer on which a high electrical field is created is constituted of InP having a wider band gap than InGaAs. Furthermore, in this element, a field-control layer that is doped to p-type is used so that an electric field with higher intensity is created on the multiplication layer rather than the absorption layer.

Since an avalanche photodiode has a higher operating voltage than a PIN photodiode, a leakage current is more likely to occur during operation. The occurrence of a leakage current results in a decline in reliability and a deterioration of an S/N ratio of the avalanche photodiode. In particular, an electric field that is created on an element side surface of the avalanche photodiode results in a surface leakage current. Therefore, an avalanche photodiode is designed so as to suppress electric field intensity on a side surface in accordance with an intended use of the avalanche photodiode.

As a technique for suppressing an electric field that is created on an element side surface of the avalanche photodiode described above, a technique has been proposed which involves forming a conductive layer in a central part of the element in a plan view by an ion implantation technique or the like in order to confine the electric field to the inside of the element (refer to NPL 1).

This avalanche photodiode will now be described with reference to FIG. 5. The avalanche photodiode includes, on a substrate 301 made of high-resistance In, an n-type contact layer 302, a buffer layer 303, a multiplication layer 305, a field-control layer 306, an absorption layer 307, and a p-type contact layer 308. In addition, the buffer layer 303 includes an n-type region 304 in a central part thereof in a plan view.

The n-type contact layer 302 is constituted of, for example, InGaAsP into which n-type impurities have been introduced at a higher concentration, and the buffer layer 303 is constituted of InP. In addition, the multiplication layer 305 is constituted of InP, and the field-control layer 306 is constituted of InP into which p-type impurities have been introduced. Furthermore, the absorption layer 307 is constituted of InGaAs, and the p-type contact layer 308 is constituted of InGaAsP into which p-type impurities have been introduced at a higher concentration. Moreover, the n-type region 304 is formed by selective ion implantation of Si (n-type impurities) with respect to the buffer layer 303.

In addition, a p-electrode 309 is formed on the p-type contact layer 308 and an n-electrode 310 is formed on the n-type contact layer 302. The p-electrode 309 is constituted of an electrode material such as Pt/Ti/Au and the n-electrode 310 is constituted of an electrode material such as Ti/Au.

An electric field intensity profile in a stack direction of each layer under operating voltage conditions of the avalanche photodiode according to NPL 1 will now be described with reference to FIG. 6. In FIG. 6, an electric field intensity profile along a line denoted by (a) in FIG. 5 which passes through the central part of the element is depicted by a solid line. In addition, in FIG. 6, an electric field intensity profile along a line denoted by (b) in FIG. 5 on a side of an element side surface is depicted by a dashed line.

As indicated by the solid line, in the central part of the element, when voltage is applied, an electric field is first created from the multiplication layer 305 and the field-control layer 306 and, after the field-control layer 306 is depleted, an electric field is created in the absorption layer 307. In contrast, on the side of the element side surface, a certain electric field is created not only in the multiplication layer 305 and the field-control layer 306 but also in the buffer layer 303 (n-type region 304). Therefore, electric field intensity in the multiplication layer 305 and in the absorption layer 307 on the side of the element side surface is lower than the central part of the element and electric field intensity in the absorption layer 307 and the multiplication layer 305 that are exposed to the element side surface is low. Accordingly, a surface leakage current on the element side surface can be suppressed.

A response speed of an avalanche photodiode is determined by element capacity, element resistance, and a travel time of a carrier from the absorption layer to each contact layer. Therefore, reducing an element diameter in a plan view to reduce element capacity is conceivable as a method of increasing speed of an avalanche photodiode.

CITATION LIST

Non Patent Literature

[NPL 1] Y. Hirota et al., "Reliable non-Zn-diffused InP/InGaAs avalanche photodiode with buried n-InP layer operated by electron injection mode", Electronics Letters, vol. 40, no. 21, 2004.

[NPL 2] H. Liu et al., "4H—SiC PIN Recessed-Window Avalanche Photodiode With High Quantum Efficiency", IEEE Photonics Technology Letters, vol. 20, no. 18, pp. 1551-1553, 2008.

[NPL 3] F. N. Masana, "Thermal characterisation of power modules", Microelectronics Reliability, vol. 40, pp. 155-161, 2000.

[NPL 4] H. Takagi et al., "Surface activated bonding of silicon wafers at room temperature", Applied Physics Letters, vol. 68, no. 16, pp. 2222-2224, 1996.

SUMMARY

Technical Problem

Since reducing an element diameter in order to increase speed as described above results in increasing current density during operation, an amount of heat generated in the multiplication layer increases. While an avalanche photodiode for non-communication applications can be constituted of a semiconductor material with high thermal conductivity such as SiC as described in NPL 2, an avalanche photodiode for optical communication applications is constituted of a material such as InGaAs or InP formed on an InP substrate as described in NPL 1. Since generated heat is mainly released to the outside of the element through the substrate, compared to non-communication applications in which a material with high thermal conductivity such as SiC is used in the substrate, heat generated in the multiplication layer upon light input is less readily transferred to the outside in the case of optical communication applications and there is room for improvement in terms of resistance (light input resistance) with respect to light input such as element failure caused by a rise in element temperature.

In order to make this improvement, an avalanche photodiode may conceivably be fabricated by growing crystals of each layer using a material such as InGaAs or InP on a substrate made of SiC or the like with excellent heat dissipation. However, since a high heat-dissipating substrate made of SiC or the like is not a lattice-match with a group III-V compound semiconductor having a band gap that conforms to a wavelength band used in optical communications such as InGaAs, there is a problem in that fabricating an element is extremely difficult. As described above, conventionally, there is a problem in that heat dissipation in an avalanche photodiode based on a group III-V compound semiconductor cannot be readily increased.

Embodiments of the present invention have been conceived in order to solve problems such as those described above and an object thereof is to increase heat dissipation in an avalanche photodiode based on a group III-V compound semiconductor.

Means for Solving the Problem

An avalanche photodiode according to embodiments of the present invention includes: a substrate constituted of a semiconductor with higher thermal conductivity than InP; an n-type contact layer which is formed on the substrate and which is made of n-type of the semiconductor; a multiplication layer which is formed on the n-type contact layer and which is made of a non-doped group III-V compound semiconductor of which a lattice constant in a planar direction matches InP; a field-control layer which is formed on the multiplication layer and which is made of a group III-V compound semiconductor of which a lattice constant in a planar direction matches InP; an absorption layer which is formed on the field-control layer and which is made of a group III-V compound semiconductor of which a lattice constant in a planar direction matches InP; and a p-type contact layer which is formed on the absorption layer and which is made of a p-type group III-V compound semiconductor of which a lattice constant in a planar direction matches InP.

The configuration example of an avalanche photodiode described above further includes: a buffer layer which is formed between the n-type contact layer and the multiplication layer and which is made of a non-doped group III-V compound semiconductor of which a lattice constant in a planar direction matches InP; and an n-type conductive layer which is formed in a central part of the buffer layer.

In the configuration example of an avalanche photodiode described above, the n-type contact layer and a layer which is formed on the n-type contact layer and which is made of a group III-V compound semiconductor are formed by being bonded to each other.

The configuration example of an avalanche photodiode described above further includes: a buffer layer which is formed between the n-type contact layer and the multiplication layer and which is made of the semiconductor that is non-doped; and an n-type conductive layer which is formed in a central part of the buffer layer.

In the configuration example of an avalanche photodiode described above, the buffer layer and the n-type conductive layer, and the n-type contact layer, are formed by being bonded to each other.

A manufacturing method of an avalanche photodiode according to embodiments of the present invention includes: a first step of forming, on a substrate constituted of a semiconductor with higher thermal conductivity than InP, an n-type contact layer made of n-type of the conductor; a second step of forming, on another substrate made of a group III-V compound semiconductor of which a lattice constant in a planar direction matches InP, a p-type contact layer which is made of a p-type group III-V compound semiconductor of which a lattice constant in a planar direction matches InP, an absorption layer which is made of a group III-V compound semiconductor of which a lattice constant in a planar direction matches InP, a field-control layer which is made of a group III-V compound semiconductor of which a lattice constant in a planar direction matches InP, and a multiplication layer which is made of a non-doped group III-V compound semiconductor of which a lattice constant in a planar direction matches InP in this order; a third step of bonding the substrate and the other substrate to each other so that a side on which the n-type contact layer is formed and a side on which the multiplication layer is formed face each other; and a fourth step of removing the other substrate after bonding the substrate and the other substrate to each other and creating a state where the n-type contact layer, the multiplication layer, the field-control layer, the absorption layer, and the p-type contact layer are stacked on the substrate in this order.

In the configuration example of the manufacturing method of an avalanche photodiode described above, the second step further includes a step of forming, on the multiplication layer, a buffer layer which is made of a non-doped group III-V compound semiconductor of which a lattice constant in a planar direction matches InP and which includes an n-type conductive layer in a central part in a plan view, and in the third step, the substrate and the other substrate are bonded to each other by bonding the n-type contact layer and the buffer layer to each other.

In the configuration example of the manufacturing method of an avalanche photodiode described above, the first step further includes a step of forming, on the n-type contact layer, a buffer layer which is made of the semiconductor that is non-doped and which includes an n-type conductive layer in a central part in a plan view, and in the third step, the substrate and the other substrate are bonded to each other by bonding the buffer layer and the multiplication layer to each other.

Effects of Embodiments of the Invention

As described above, according to embodiments of the present invention, since a substrate and an n-type contact layer are constituted of a semiconductor with a higher thermal conductivity than InP, heat dissipation in an avalanche photodiode based on a group III-V compound semiconductor can be increased.

DETAILED DESCRIPTION OF ILLUSTRATIVE EMBODIMENTS

Avalanche photodiodes according to embodiments of the present invention will be described below.

First Embodiment

Figure 1:
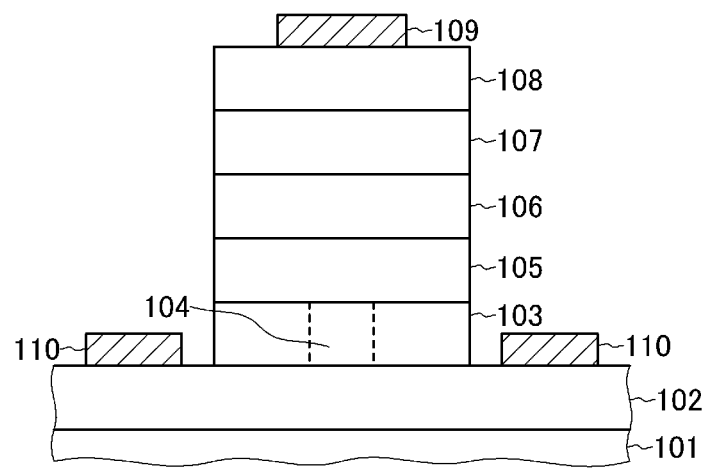
FIG. 1 is a sectional view showing a configuration of an avalanche photodiode according to a first embodiment of the present invention.

First, an avalanche photodiode according to a first embodiment of the present invention will be described with reference to FIG. 1.

The avalanche photodiode includes a substrate 101, an n-type contact layer 102, a multiplication layer 105, a field-control layer 106, an absorption layer 107, and a p-type contact layer 108. In addition, the avalanche photodiode according to the first embodiment includes a buffer layer 103 and a conductive layer 104. Furthermore, the buffer layer 103, the multiplication layer 105, the field-control layer 106, the absorption layer 107, and the p-type contact layer 108 are formed in a prescribed mesa shape.

The substrate 101 is constituted of a semiconductor with a higher thermal conductivity than InP. For example, the substrate 101 is constituted of SiC. Alternatively, the substrate 101 can be constituted of a diamond, AlN, or the like. The n-type contact layer 102 is formed on the substrate 101, constituted of a same semiconductor as the substrate 101, and made n-type. For example, the n-type contact layer 102 is constituted of SiC into which n-type impurities have been introduced at a relatively high concentration.

The multiplication layer 105 is formed on the n-type contact layer 102 and is constituted of a non-doped group III-V compound semiconductor of which a lattice constant in a planar direction matches InP. For example, the multiplication layer 105 is constituted of non-doped InP. Alternatively, the multiplication layer 105 can be constituted of InAlAs.

The buffer layer 103 is formed between the n-type contact layer 102 and the multiplication layer 105 and is constituted of a non-doped group III-V compound semiconductor of which a lattice constant in a planar direction matches InP. For example, the buffer layer 103 is constituted of InP. The conductive layer 104 is formed in a central part of the buffer layer 103 in a plan view (in a planar direction). A central axis of the conductive layer 104 need not match that of the buffer layer 103 in a plan view and the conductive layer 104 need only be formed so as to be separated from a side surface of the buffer layer 103. The conductive layer 104 can be formed by selectively introducing n-type impurities into the central part of the buffer layer 103 in a plan view. The buffer layer 103 is formed so as to come into contact with both the n-type contact layer 102 and the multiplication layer 105. In addition, the conductive layer 104 is formed so as to penetrate the buffer layer 103 in a thickness direction. The conductive layer 104 is in contact with both the n-type contact layer 102 and the multiplication layer 105.

The field-control layer 106 is formed on the multiplication layer 105 and is constituted of a group III-V compound semiconductor of which a lattice constant in a planar direction matches InP. For example, the field-control layer 106 is constituted of InP having been made p-type by introducing p-type impurities.

The absorption layer 107 is formed on the field-control layer 106 and is constituted of a group III-V compound semiconductor of which a lattice constant in a planar direction matches InP. For example, the absorption layer 107 is constituted of InGaAs. The p-type contact layer 108 is formed on the absorption layer 107 and is constituted of a p-type group III-V compound semiconductor of which a lattice constant in a planar direction matches InP. For example, the p-type contact layer 108 is constituted of InGaAsP into which n-type impurities have been introduced at a relatively high concentration. Alternatively, the p-type contact layer 108 can be constituted of InAlGaAs, InP, InGaAs, or the like.

In addition, in the avalanche photodiode according to the first embodiment, the n-type contact layer 102 which is made of the semiconductor that constitutes the substrate 101 and which is arranged adjacent in a stacking direction and the buffer layer 103 which is made of a group III-V compound semiconductor are formed by being bonded to each other. The buffer layer 103 is formed on the n-type contact layer 102 by bonding between dissimilar materials instead of being formed by crystal (epitaxial) growth on the n-type contact layer 102.

In addition, a p-electrode 109 is formed on the p-type contact layer 108. Furthermore, an n-electrode no is formed on the n-type contact layer 102 around the buffer layer 103 that has a mesa shape. The p-electrode 109 is constituted of an electrode material such as Pt/Ti/Au and the n-electrode no is constituted of an electrode material such as Ni/Au.

In the avalanche photodiode according to the first embodiment, heat generated by the multiplication layer 105 is transferred to the substrate 101 via the conductive layer 104 (the buffer layer 103) and the n-type contact layer 102. According to conventional art, since an n-type contact layer must be constituted of InGaAsP and a substrate must be constituted of InP, heat cannot be efficiently dissipated even when a heat sink is connected to the substrate. With the avalanche photodiode according to the first embodiment, since the n-type contact layer 102 and the substrate 101 are constituted of a semiconductor with good thermal conductivity, heat can be dissipated more efficiently than in conventional art by connecting a heat sink to the substrate 101.

For example, in the avalanche photodiode according to the first embodiment with a mesa diameter (an element diameter) of 5 μm in a plan view, thermal resistance that is estimated in a region from the buffer layer 103 to the substrate 101 is 480 K/W. On the other hand, in a conventional avalanche photodiode with a mesa diameter (an element diameter) of 5 μm in a plan view, thermal resistance that is estimated in a region from the buffer layer to the substrate is 3500 K/W. The thermal resistances described above were calculated according to a method described in NPL 3 with respective thicknesses of the buffer layer 103, the n-type contact layer 102, and the substrate 101 being 200 nm, 30 nm, and 100 μm and respective thermal conductivities of InP, InGaAsP, and SiC being 68, 1.0, and 370 W/mK.

As described above, while a temperature rise near the multiplication layer 105 which is estimated during an operation of the conventional avalanche photodiode at 20 V and 1 mA is 69° C., the temperature rise can be brought down to 9.6° C. with the avalanche photodiode according to the first embodiment.

As described above, since the n-type contact layer 102 is constituted of a semiconductor with a higher thermal conductivity than InP in addition to the substrate 101, according to the first embodiment, heat dissipation in an avalanche photodiode based on a group III-V compound semiconductor can be increased and an improvement in light input resistance can be realized.

Next, a manufacturing method of the avalanche photodiode according to the first embodiment of the present invention will be described with reference to FIGS. 2A to 2D.

Figure 2A:
FIG. 2A is a sectional view showing an element cross-section for explaining a manufacturing method of an avalanche photodiode according to the first embodiment of the present invention.

First, as shown in FIG. 2A, the n-type contact layer 102 made of an n-type semiconductor is formed on the substrate 101 (first step). For example, the n-type contact layer 102 can be formed by depositing SiC on the substrate 101 using a known chemical vapor deposition (CVD) method or the like.

Figure 2B:
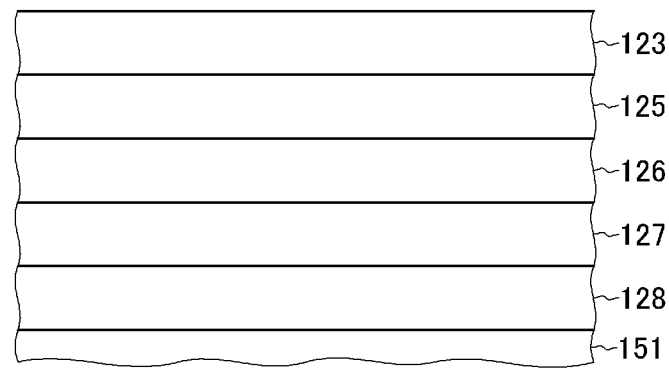
FIG. 2B is a sectional view showing an element cross-section for explaining the manufacturing method of an avalanche photodiode according to the first embodiment of the present invention.

In addition, as shown in FIG. 2B, a first semiconductor layer 128, a second semiconductor layer 127, a third semiconductor layer 126, and a fourth semiconductor layer 125 are formed in this order on another substrate 151 (second step). Furthermore, in the first embodiment, a fifth semiconductor layer 123 is formed on the fourth semiconductor layer 125.

The other substrate 151 is constituted of a group III-V compound semiconductor of which a lattice constant in a planar direction matches InP. For example, the other substrate 151 is constituted of high-resistance InP. The first semiconductor layer 128 is a layer to become the p-type contact layer 108 and is constituted of a p-type group III-V compound semiconductor of which a lattice constant in a planar direction matches InP. For example, the first semiconductor layer 128 is constituted of InGaAsP into which n-type impurities have been introduced at a relatively high concentration.

The second semiconductor layer 127 is a layer to become the absorption layer 107 and is constituted of a group III-V compound semiconductor of which a lattice constant in a planar direction matches InP. For example, the second semiconductor layer 127 is constituted of InGaAs. The third semiconductor layer 126 is a layer to become the field-control layer 106 and is constituted of a group III-V compound semiconductor of which a lattice constant in a planar direction matches InP. For example, the third semiconductor layer 126 is constituted of InP having been made p-type.

The fourth semiconductor layer 125 is a layer to become the multiplication layer 105 and is constituted of a non-doped group III-V compound semiconductor of which a lattice constant in a planar direction matches InP. For example, the fourth semiconductor layer 125 is constituted of non-doped InP. The fifth semiconductor layer 123 is a layer to become the buffer layer 103 and is constituted of a non-doped group III-V compound semiconductor of which a lattice constant in a planar direction matches InP. For example, the fifth semiconductor layer 123 is constituted of InP.

The first semiconductor layer 128, the second semiconductor layer 127, the third semiconductor layer 126, the fourth semiconductor layer 125, and the fifth semiconductor layer 123 described above are formed by sequential epitaxial growth on the other substrate 151 by, for example, metalorganic vapor deposition.

Figure 2C:
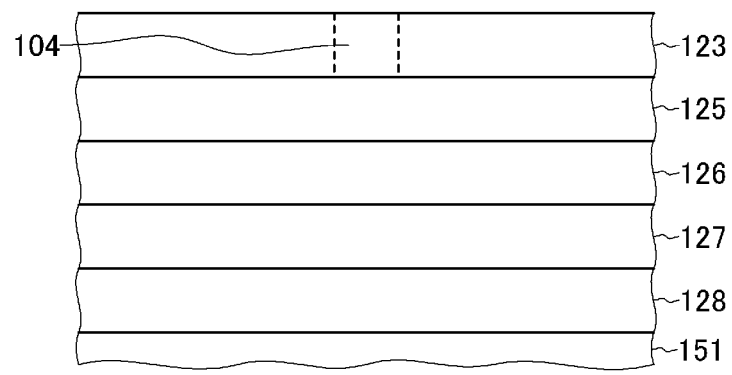
FIG. 2C is a sectional view showing an element cross-section for explaining the manufacturing method of an avalanche photodiode according to the first embodiment of the present invention.

Next, as shown in FIG. 2C, the conductive layer 104 having n-type conductivity is formed in a central part in a planar direction of the fifth semiconductor layer 123. The conductive layer 104 is formed by introducing n-type impurities such as Si into a region of the fifth semiconductor layer 123 to be the conductive layer 104 by, for example, selective ion implantation.

Figure 2D:
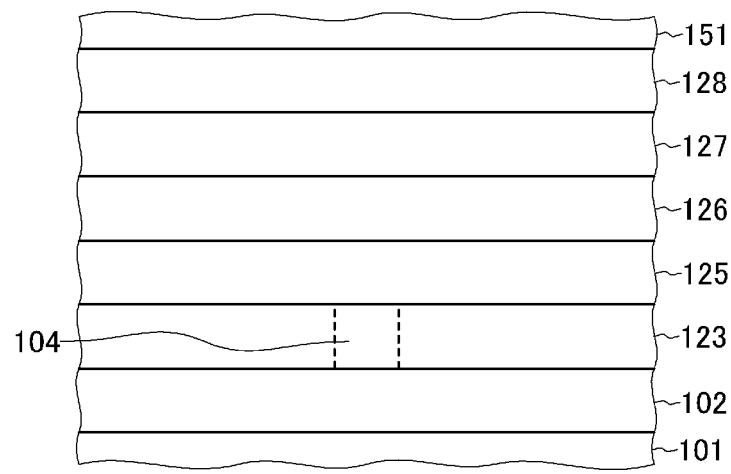
FIG. 2D is a sectional view showing an element cross-section for explaining the manufacturing method of an avalanche photodiode according to the first embodiment of the present invention.

Next, as shown in FIG. 2D, the substrate 101 and the other substrate 151 are bonded to each other by having a side on which the n-type contact layer 102 is formed and a side on which the fourth semiconductor layer 125 (the multiplication layer 105) are formed face each other (third step). In the first embodiment, the substrate 101 and the other substrate 151 are bonded to each other by bonding the n-type contact layer 102 and the fifth semiconductor layer 123 (the buffer layer 103) to each other (third step). For example, a surface activation treatment using an Ar beam is performed on a bonding surface of the n-type contact layer 102 and a bonding surface of the fifth semiconductor layer 123 and the bonding surfaces are bonded to each other (refer to NPL 4).

Next, the other substrate 151 is removed to create a state where the n-type contact layer 102, the fifth semiconductor layer 123, the fourth semiconductor layer 125, the third semiconductor layer 126, the second semiconductor layer 127, and the first semiconductor layer 128 are stacked on the substrate 101 in this order (fourth step). For example, the other substrate 151 is peeled and removed by polishing, etching, or the like.

Subsequently, by patterning the fifth semiconductor layer 123, the fourth semiconductor layer 125, the third semiconductor layer 126, the second semiconductor layer 127, and the first semiconductor layer 128 into mesas using a known lithographic technique and a known etching technique, the buffer layer 103, the multiplication layer 105, the field-control layer 106, the absorption layer 107, and the p-type contact layer 108 are formed on the n-type contact layer 102. A diameter of the mesas in a plan view is to be larger than the conductive layer 104.

In addition, the p-electrode 109 is formed on the p-type contact layer 108, and the n-electrode no is formed on the n-type contact layer 102 around the buffer layer 103 having been given a mesa shape. For example, a lift-off mask having an opening is formed in an electrode-forming region, a prescribed electrode material is deposited on the lift-off mask by vapor deposition or the like and, subsequently, the lift-off mask is removed (lifted off) to form the p-electrode 109 and the n-electrode 110.

With the manufacturing method according to the first embodiment described above, an avalanche photodiode can be constructed by the buffer layer 103 (the conductive layer 104), the multiplication layer 105, the field-control layer 106, the absorption layer 107, and the p-type contact layer 108 which are made of a group III-V compound semiconductor and which are formed on the substrate 101 and the n-type contact layer 102 which are constituted of a semiconductor with a higher thermal conductivity than InP such as SiC.

Second Embodiment

Figure 3:
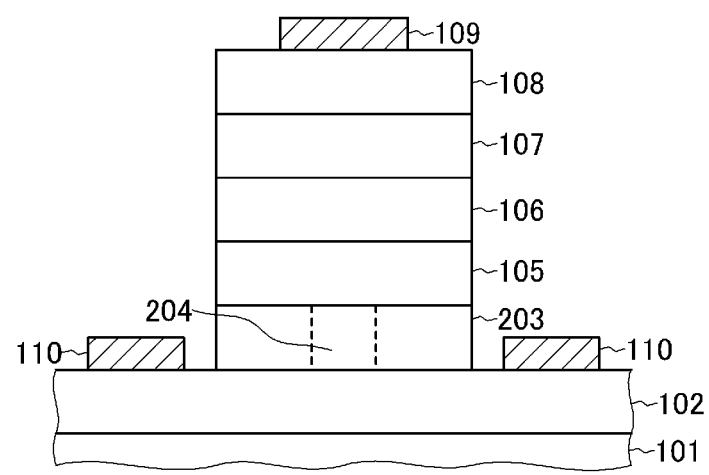
FIG. 3 is a sectional view showing a configuration of an avalanche photodiode according to a second embodiment of the present invention.

Next, an avalanche photodiode according to a second embodiment of the present invention will be described with reference to FIG. 3.

The avalanche photodiode includes the substrate 101, the n-type contact layer 102, the multiplication layer 105, the field-control layer 106, the absorption layer 107, and the p-type contact layer 108. In addition, the avalanche photodiode according to the second embodiment includes a buffer layer 203 and a conductive layer 204. Furthermore, the buffer layer 203, the multiplication layer 105, the field-control layer 106, the absorption layer 107, and the p-type contact layer 108 are formed in a prescribed mesa shape.

The substrate 101, the n-type contact layer 102, the multiplication layer 105, the field-control layer 106, the absorption layer 107, and the p-type contact layer 108 are similar to those in the first embodiment described earlier. In the second embodiment, the buffer layer 203 is constituted of a same semiconductor as the substrate 101 (the n-type contact layer 102). For example, the buffer layer 203 is constituted of SiC. It should be noted that the conductive layer 204 is a conductive region that is formed by selectively introducing n-type impurities into a central part of the buffer layer 203 in a plan view (in a planar direction). The buffer layer 203 is formed so as to come into contact with both the n-type contact layer 102 and the multiplication layer 105. In addition, the conductive layer 204 is formed so as to penetrate the buffer layer 203 in a thickness direction. The conductive layer 204 is in contact with both the n-type contact layer 102 and the multiplication layer 105.

In addition, in the avalanche photodiode according to the second embodiment, the buffer layer 203 which is made of the semiconductor that constitutes the substrate 101 and which is arranged adjacent in a stacking direction and the multiplication layer 105 which is made of a group III-V compound semiconductor are formed by being bonded to each other. The multiplication layer 105 is formed on the buffer layer 203 by bonding between dissimilar materials as described later instead of being formed by crystal (epitaxial) growth on the buffer layer 203.

In addition, the p-electrode 109 is formed on the p-type contact layer 108 and the n-electrode no is formed on the n-type contact layer 102 around the buffer layer 203.

In the avalanche photodiode according to the second embodiment, heat generated by the multiplication layer 105 is transferred to the substrate 101 via the conductive layer 204 (the buffer layer 203) and the n-type contact layer 102. According to conventional art, since a buffer layer must be constituted of InP, an n-type contact layer must be constituted of InGaAsP, and a substrate must be constituted of InP, heat cannot be efficiently dissipated even when a heat sink is connected to the substrate. With the avalanche photodiode according to the second embodiment, since the buffer layer 203 is constituted of a semiconductor with good thermal conductivity in addition to the n-type contact layer 102 and the substrate 101, heat can be dissipated more efficiently than in conventional art by connecting a heat sink to the substrate 101. In the second embodiment, since the buffer layer 203 is also constituted of a semiconductor with good thermal conductivity, heat can be dissipated even more efficiently than in the first embodiment.

For example, in the avalanche photodiode according to the second embodiment with a mesa diameter (an element diameter) of 5 μm in a plan view, thermal resistance that is estimated in a region from the buffer layer 203 to the substrate 101 is 360 K/W. This demonstrates that a temperature rise near the multiplication layer 105 which is estimated during an operation of the avalanche photodiode according to the second embodiment at 20 V and 1 mA can be brought down to 7.2° C.

As described above, since the buffer layer 203 is constituted of a semiconductor with a higher thermal conductivity than InP in addition to the substrate 101 and the n-type contact layer 102, according to the second embodiment, heat dissipation in an avalanche photodiode based on a group III-V compound semiconductor can be increased and an improvement in light input resistance can be realized.

An offset of approximately 0.5 eV in a conduction band exists in a band lineup between the multiplication layer 105 made of InP and the conductive layer 204 made of n-type SiC. However, conceivably, a width of a potential barrier between the multiplication layer 105 and the conductive layer 204 is thin, electrons are capable of passing between the multiplication layer 105 and the conductive layer 204 by tunneling, and an effect of the offset on sensitivity is negligible. For example, assuming that a doping concentration of the multiplication layer 105 is $1 \times 10^{16}$ cm$^{-3}$ and a doping concentration of the conductive layer 204 is $1 \times 10^{19}$ cm$^{-3}$, a width of the barrier between the layers is estimated as 1 nm or less.

Next, a manufacturing method of the avalanche photodiode according to the second embodiment of the present invention will be described with reference to FIGS. 4A to 4D.

Figure 4A:
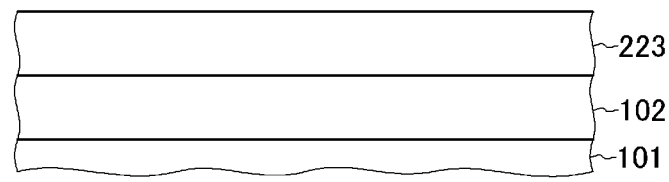
FIG. 4A is a sectional view showing an element cross-section for explaining a manufacturing method of an avalanche photodiode according to the second embodiment of the present invention.

First, as shown in FIG. 4A, the n-type contact layer 102 made of an n-type semiconductor and a fifth semiconductor layer 223 are formed on the substrate 101 (first step). The fifth semiconductor layer 223 is a layer to become the buffer layer 203. For example, the n-type contact layer 102 and the fifth semiconductor layer 223 can be formed by depositing SiC on the substrate 101 using a known chemical vapor deposition method or the like.

Figure 4B:
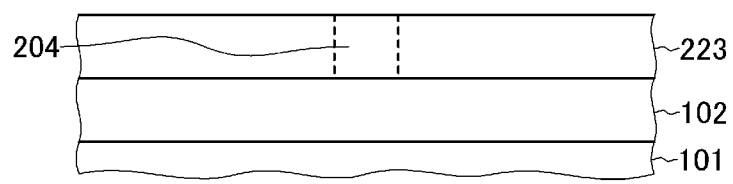
FIG. 4B is a sectional view showing an element cross-section for explaining the manufacturing method of an avalanche photodiode according to the second embodiment of the present invention.

Next, as shown in FIG. 4B, the conductive layer 204 having n-type conductivity is formed in a central part in a planar direction of the fifth semiconductor layer 223. The conductive layer 204 is formed by introducing n-type impurities such as P into a region of the fifth semiconductor layer 223 to be the conductive layer 204 by, for example, selective ion implantation.

Figure 4C:
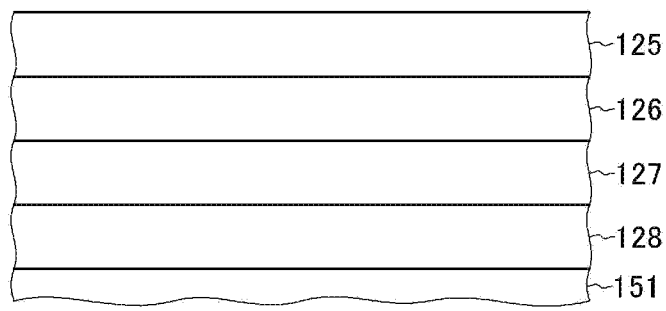
FIG. 4C is a sectional view showing an element cross-section for explaining the manufacturing method of an avalanche photodiode according to the second embodiment of the present invention.

In addition, as shown in FIG. 4C, the first semiconductor layer 128, the second semiconductor layer 127, the third semiconductor layer 126, and the fourth semiconductor layer 125 are formed in this order on the other substrate 151 (second step). The first semiconductor layer 128, the second semiconductor layer 127, the third semiconductor layer 126, and the fourth semiconductor layer 125 are similar to those in the first embodiment described earlier.

Figure 4D:
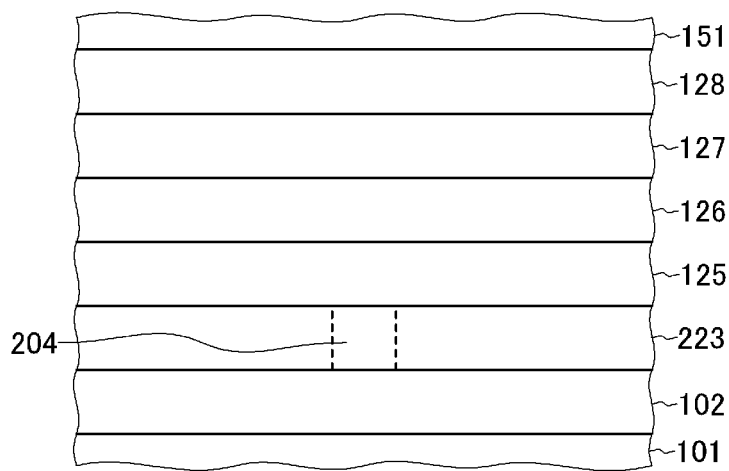
FIG. 4D is a sectional view showing an element cross-section for explaining the manufacturing method of an avalanche photodiode according to the second embodiment of the present invention.
Figure 5:
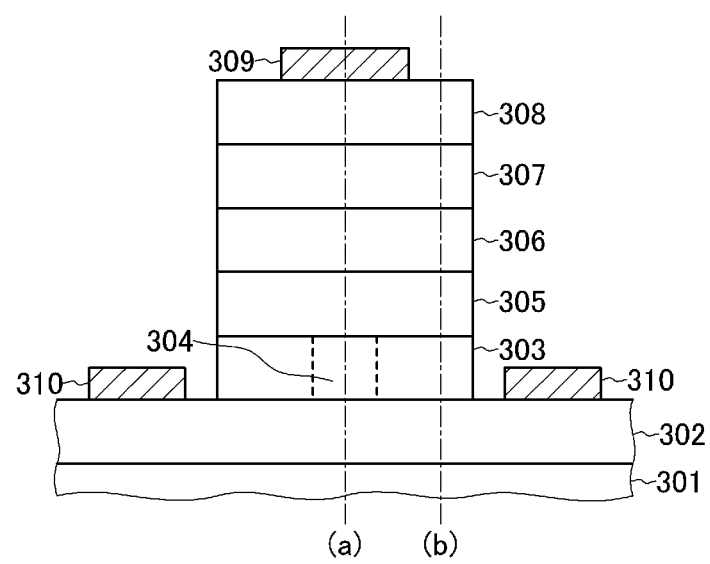
FIG. 5 is a sectional view showing a configuration of an avalanche photodiode.
Figure 6:
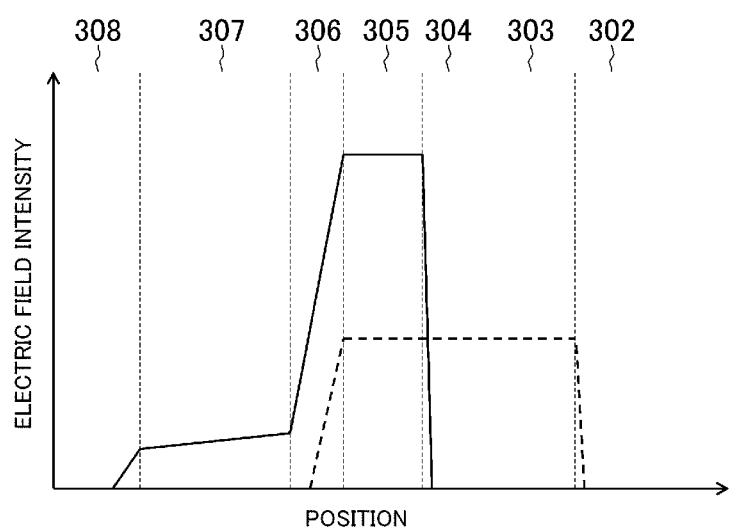
FIG. 6 is a characteristic diagram showing an electric field intensity profile in a stack direction of each layer of the avalanche photodiode shown in FIG. 5.

Next, as shown in FIG. 4D, the substrate 101 and the other substrate 151 are bonded to each other by having a side on which the n-type contact layer 102 is formed and a side on which the fourth semiconductor layer 125 (the multiplication layer 105) are formed face each other (third step). In the second embodiment, the substrate 101 and the other substrate 151 are bonded to each other by bonding the fifth semiconductor layer 223 (the buffer layer 203) and the fourth semiconductor layer 125 to each other (third step). For example, a surface activation treatment using an Ar beam is performed on a bonding surface of the fifth semiconductor layer 223 and a bonding surface of the fourth semiconductor layer 125 and the bonding surfaces are bonded to each other (refer to NPL 4).

Next, the other substrate 151 is removed to create a state where the n-type contact layer 102, the fifth semiconductor layer 223, the fourth semiconductor layer 125, the third semiconductor layer 126, the second semiconductor layer 127, and the first semiconductor layer 128 are stacked on the substrate 101 in this order (fourth step). For example, the other substrate 151 is peeled and removed by polishing, etching, or the like.

Subsequently, by patterning the fifth semiconductor layer 223, the fourth semiconductor layer 125, the third semiconductor layer 126, the second semiconductor layer 127, and the first semiconductor layer 128 into mesas using a known lithographic technique and a known etching technique, the buffer layer 203, the multiplication layer 105, the field-control layer 106, the absorption layer 107, and the p-type contact layer 108 are formed on the n-type contact layer 102. A diameter of the mesas in a plan view is to be larger than the conductive layer 204.

In addition, in a similar manner to the first embodiment, the p-electrode 109 is formed on the p-type contact layer 108, and the n-electrode 110 is formed on the n-type contact layer 102 around the buffer layer 203 having been given a mesa shape.

With the manufacturing method according to the second embodiment described above, an avalanche photodiode can be constructed by the multiplication layer 105, the field-control layer 106, the absorption layer 107, and the p-type contact layer 108 which are made of a group III-V compound semiconductor and which are formed on the substrate 101, the n-type contact layer 102, and the buffer layer 203 (the conductive layer 204) which are constituted of a semiconductor with a higher thermal conductivity than InP such as SiC.

As described above, according to embodiments of the present invention, since a substrate and an n-type contact layer are constituted of a semiconductor with a higher thermal conductivity than InP, heat dissipation in an avalanche photodiode based on a group III-V compound semiconductor can be increased.

It is to be understood that the present invention is not limited to the embodiments described above and that many modifications and combinations will obviously occur to those skilled in the art without departing from the technical scope of the present invention.

REFERENCE SIGNS LIST

101 Substrate
102 n-type contact layer
103 Buffer layer
104 Conductive layer
105 Multiplication layer
106 Field-control layer
107 Absorption layer
108 p-type contact layer
109 p-electrode
110 n-electrode

The invention claimed is:

1. An avalanche photodiode comprising:
   a substrate comprising a semiconductor having a higher thermal conductivity than InP;
   an n-type contact layer on the substrate and comprising an n-type of the semiconductor;
   a multiplication layer on the n-type contact layer and comprising a non-doped group III-V compound semiconductor having a lattice constant in a planar direction that matches that of InP;
   a field-control layer on the multiplication layer and comprising a first group III-V compound semiconductor having a lattice constant in a planar direction that matches that of InP;
   an absorption layer on the field-control layer and comprising a second group III-V compound semiconductor having a lattice constant in a planar direction that matches that of InP; and
   a p-type contact layer on the absorption layer and comprising a p-type group III-V compound semiconductor having a lattice constant in a planar direction that matches that of InP.

2. The avalanche photodiode according to claim 1, further comprising:
   a buffer layer between the n-type contact layer and the multiplication layer and comprising a second non-doped group III-V compound semiconductor having a lattice constant in a planar direction that matches that of InP; and
   an n-type conductive layer in a central part of the buffer layer in a plan view.

3. The avalanche photodiode according to claim 1, further comprising a layer on the n-type contact layer and comprising a third group III-V compound semiconductor.

4. The avalanche photodiode according to claim 3, wherein the n-type contact layer is bonded to the layer formed on the n-type contact layer.

5. The avalanche photodiode according to claim 1, further comprising:
   a buffer layer between the n-type contact layer and the multiplication layer and comprising the semiconductor that is non-doped; and
   an n-type conductive layer in a central part of the buffer layer in a plan view.

6. The avalanche photodiode according to claim 5, wherein the buffer layer and the n-type conductive layer are bonded to the n-type contact layer.

7. A method of manufacturing an avalanche photodiode, the method comprising:
- a first step of forming an n-type contact layer on a first substrate comprising a semiconductor with a higher thermal conductivity than InP, wherein the n-type contact layer comprises an n-type of the semiconductor;
- a second step of forming a p-type contact layer on a second substrate, the second substrate comprising a first group III-V compound semiconductor having a lattice constant in a planar direction that matches that of InP, wherein the p-type contact layer comprises a p-type group III-V compound semiconductor having a lattice constant in a planar direction that matches that of InP, forming an absorption layer on the p-type contact layer, the absorption layer comprising a second group III-V compound semiconductor having a lattice constant in a planar direction that matches that of InP, forming a field-control layer on the absorption layer, the field-control layer comprising a third group III-V compound semiconductor having a lattice constant in a planar direction that matches that of InP, and forming a multiplication layer on the field-control layer, the multiplication layer comprising a non-doped group III-V compound semiconductor having a lattice constant in a planar direction that matches that of InP;
- a third step of bonding the first substrate and the second substrate to each other so that a side of the first substrate on which the n-type contact layer is formed and a side of the second substrate on which the multiplication layer is formed face each other; and
- a fourth step of removing the second substrate after bonding the first substrate and the second substrate to each other, wherein the n-type contact layer, the multiplication layer, the field-control layer, the absorption layer, and the p-type contact layer are stacked on the first substrate in this order.

8. The method according to claim 7, wherein the second step further comprises forming a buffer layer on the multiplication layer, wherein the buffer layer comprises a second non-doped group III-V compound semiconductor having a lattice constant in a planar direction that matches that of InP, and wherein the buffer layer includes an n-type conductive layer in a central part of the buffer layer in a plan view.

9. The method according to claim 8, wherein bonding the first substrate and the second substrate to each other comprises bonding the n-type contact layer and the buffer layer to each other.

10. The method according to claim 7, wherein the first step further comprises forming a buffer layer on the n-type contact layer, wherein the buffer layer comprises the semiconductor that is non-doped, and wherein the buffer layer includes an n-type conductive layer in a central part of the buffer layer.

11. The method according to claim 10, wherein bonding the first substrate and the second substrate to each other comprises bonding the buffer layer and the multiplication layer to each other.

* * * * *